(12) United States Patent
Yun et al.

(10) Patent No.: US 6,967,150 B2
(45) Date of Patent: Nov. 22, 2005

(54) METHOD OF FORMING SELF-ALIGNED CONTACT IN FABRICATING SEMICONDUCTOR DEVICE

(75) Inventors: Cheol-Ju Yun, Gyeonggi-do (KR); Tae-Young Chung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/938,154

(22) Filed: Sep. 10, 2004

(65) Prior Publication Data
US 2005/0186733 A1   Aug. 25, 2005

(30) Foreign Application Priority Data
Feb. 19, 2004   (KR) .......................... 10-2004-11082

(51) Int. Cl.$^7$ ................ H01L 21/3205; H01L 21/4763
(52) U.S. Cl. ...................... 438/586; 438/587; 438/588; 438/637
(58) Field of Search ............... 438/586, 587, 438/588, 637, FOR 355

(56) References Cited

U.S. PATENT DOCUMENTS

| | | | |
|---|---|---|---|
| 5,989,965 A | * | 11/1999 | Maa et al. .................... 438/303 |
| 6,140,172 A | * | 10/2000 | Parekh ......................... 438/238 |
| 6,204,161 B1 | * | 3/2001 | Chung et al. ................ 438/612 |
| 6,242,331 B1 | * | 6/2001 | Chu et al. .................... 438/586 |
| 6,242,332 B1 | * | 6/2001 | Cho et al. .................... 438/587 |
| 6,573,551 B1 | | 6/2003 | Kim et al. |
| 2002/0090837 A1 | * | 7/2002 | Chung et al. ................ 438/980 |
| 2002/0093099 A1 | * | 7/2002 | Juengling et al. ........... 257/752 |

FOREIGN PATENT DOCUMENTS

| | | |
|---|---|---|
| JP | 2003-249572 | 9/2003 |
| KR | 2003-0032723 | 4/2003 |

OTHER PUBLICATIONS

English language abstract of Korean Publication No. 2003-0032723.
English language abstract of Japanese Publication No. 2003-249572.

* cited by examiner

*Primary Examiner*—George Fourson
*Assistant Examiner*—Michelle Estrada
(74) *Attorney, Agent, or Firm*—Marger Johnson & McCollom, P.C.

(57) ABSTRACT

According to some embodiments of the invention, a method of forming a self-aligned contact of a semiconductor device includes forming a plurality of conductive lines that are spaced apart from each other and pass over a plurality of conductive regions. An insulating layer is formed over and between the conductive lines. A plurality of contact holes are then formed to selectively expose the conductive regions by selectively removing the insulating layer without exposing the conductive lines. The contact holes are extended using an isotropic etching until the conductive lines begin to be exposed. Thereafter, contacts are formed in the contact holes such that the contacts are coupled to the conductive regions.

12 Claims, 10 Drawing Sheets

and passing over a plurality of conductive regions; forming an insulating layer over and between the conductive lines; forming a plurality of contact holes selectively exposing the conductive regions by selectively removing the insulating layer without exposing the conductive lines; extending the contact holes by using an isotropic etching until the conductive lines begin to be exposed; and forming contacts in the contact holes such that the contacts are coupled to the conductive regions. The

METHOD OF FORMING SELF-ALIGNED CONTACT IN FABRICATING SEMICONDUCTOR DEVICE

CROSS REFERENCE TO RELATED APPLICATIONS

This application claims priority from Korean Patent Application No. 2004-11082, filed 19 Feb. 2004, the contents of which are incorporated by reference in their entirety for all purposes.

BACKGROUND OF THE INVENTION

1. Field of the Invention

This disclosure relates generally to semiconductor device fabrication technology and, more particularly, to a method of forming a self-aligned contact in fabricating a semiconductor device such as a memory device.

2. Description of the Related Art

As semiconductor devices becomes increasingly integrated and design rules are reduced, semiconductor fabrication technology encounters a variety of difficulties in forming circuit patterns. One such difficulty arises during the process of forming a storage node contact in a dynamic random access memory (DRAM). The storage node contact connects a storage electrode and a source region. When the storage node contact is formed in a self-aligned manner, the storage node contact may often be short-circuited with an underlying bit line. Furthermore, forming the storage node contact in such a self-aligned manner may increase the contact resistance. Increasing the thickness of a bit line mask and a bit line spacer may be favorable for the formation of the self-aligned contact. This may, however, cause voids when filling a gap between the bit lines.

A conventional method of forming the self-aligned contact is described hereinafter with reference to FIGS. 1–13. FIGS. 1 through 6 show a conventional method of fabricating the semiconductor device, and FIGS. 7 through 13 show a conventional method of forming the self-aligned contact. FIGS. 1 through 6 are plan views, and FIGS. 7 through 13 are cross-sectional views taken along the line A—A in FIG. 6, namely, in a word line direction.

Figure 1:
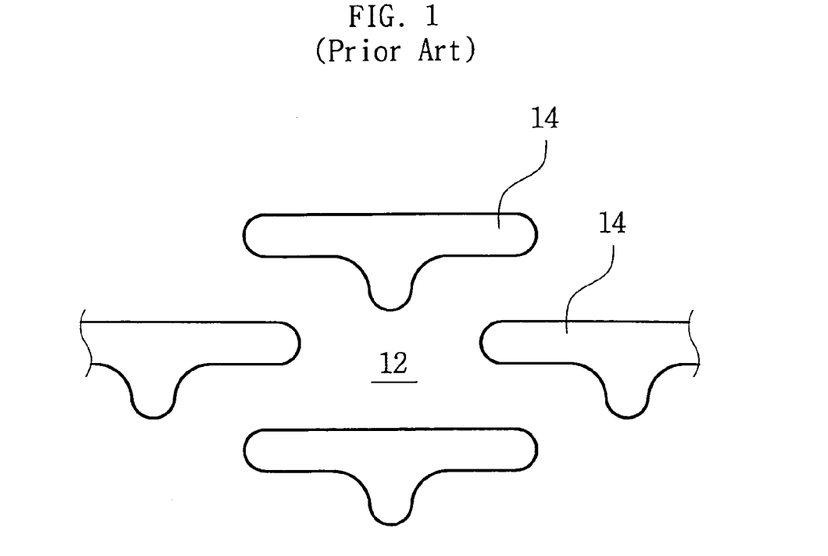
FIG. 1 is a plan diagram illustrating a process of forming an isolation region.
Figure 2:
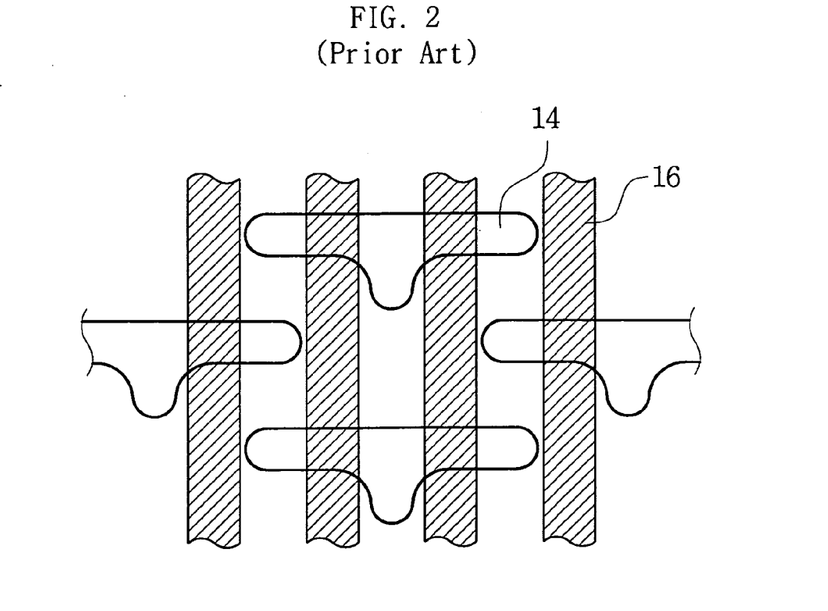
FIG. 2 is a plan diagram illustrating a process of forming word lines.
Figure 3:
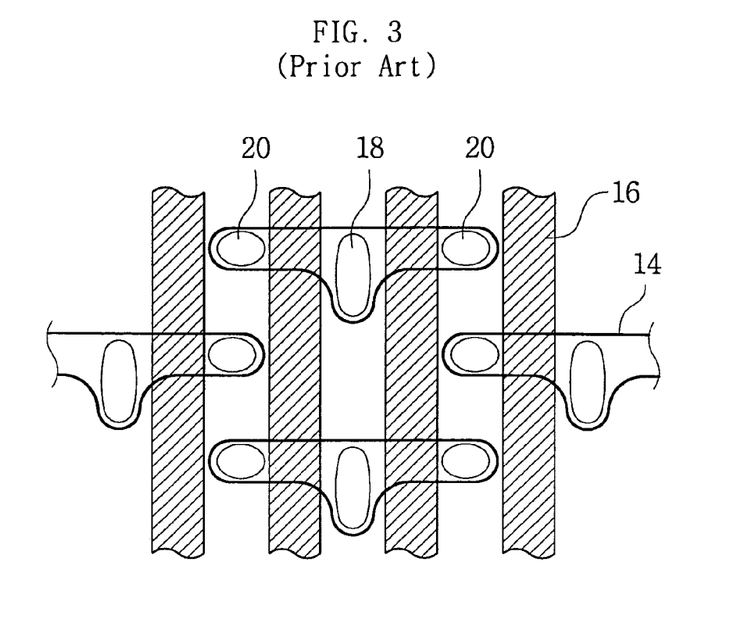
FIG. 3 is a plan diagram illustrating a process of forming contact pads.

Referring to FIG. 1, an isolation region 12 is formed in a semiconductor substrate (10 in FIG. 7), and thereby a number of active regions 14 are defined and surrounded by the isolation region 12. Next, as shown in FIGS. 2 and 3, word lines 16 (i.e., gate lines) and contact pads 18 and 20 are formed sequentially. Contact pad 18 is for a bit line contact that will connect a bit line and a drain region, and contact pad 20 for a storage node contact that will connect a storage electrode and a source region. The bit line contact and the storage node contact are also referred to as a direct contact (DC) and a buried contact (BC), respectively.

Figure 4:
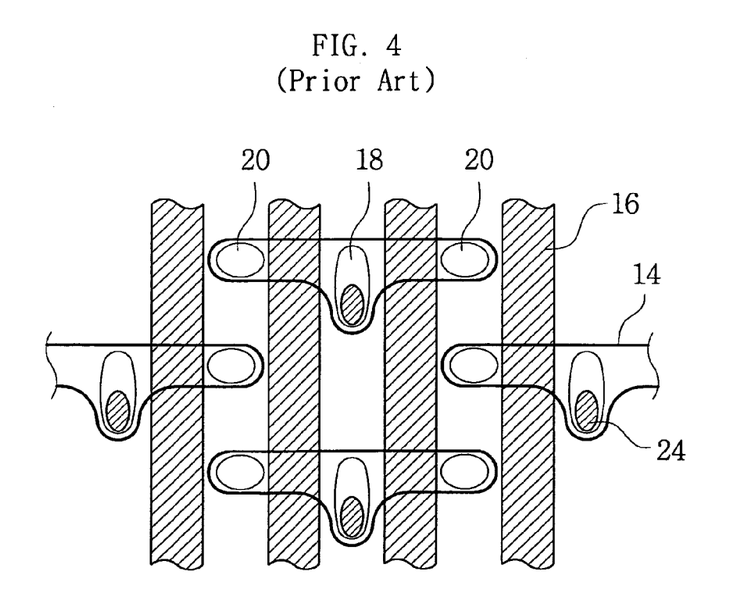
FIG. 4 is a plan diagram illustrating a process of forming bit line contacts.
Figure 5:
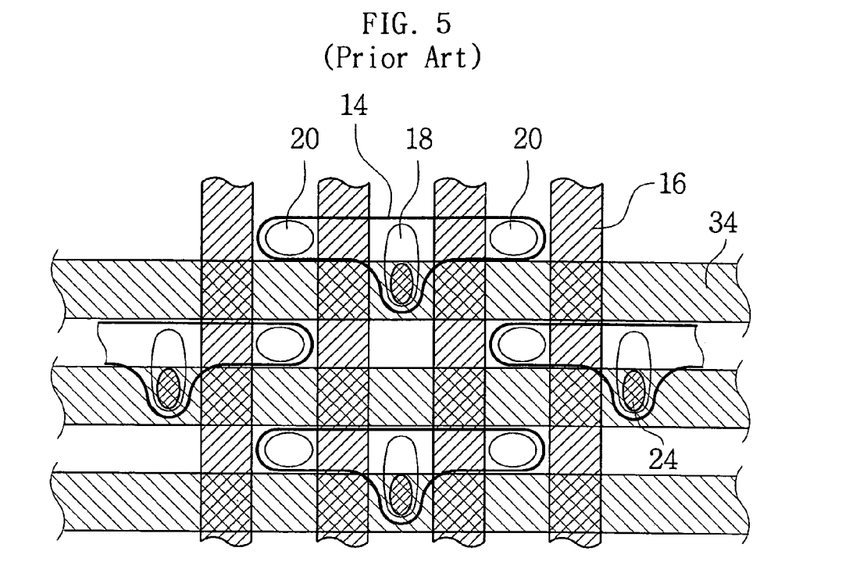
FIG. 5 is a plan diagram illustrating a process of forming bit lines.
Figure 6:
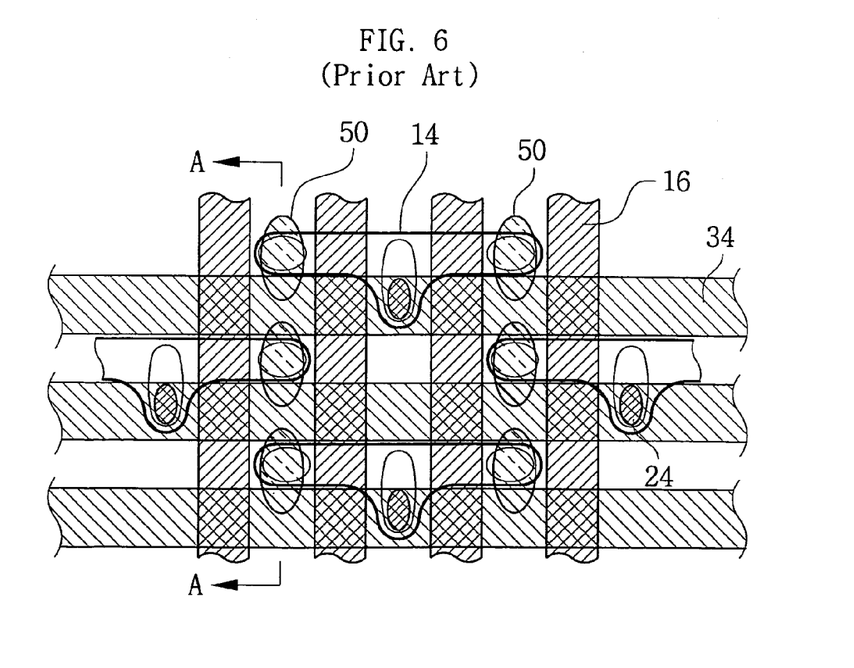
FIG. 6 is a plan diagram illustrating a process of forming storage node contacts.

Next, a first interlayer dielectric layer (22 in FIG. 7) is formed to cover the resultant structure. As shown in FIG. 4, bit line contacts 24 are selectively formed in the first interlayer dielectric layer and extend downward to touch the bit line contact pads 18. Thereafter, as shown in FIGS. 5 and 6, bit lines 34 and storage node contacts 50 are formed sequentially.

The conventional method described above reaches its limits for design rules of 0.1 μm or less. In particular, the process of forming the storage node contact 50 becomes critical. The following is a detailed description from a step of forming the bit lines 34 through a step of forming the storage node contact 50.

Figure 7:
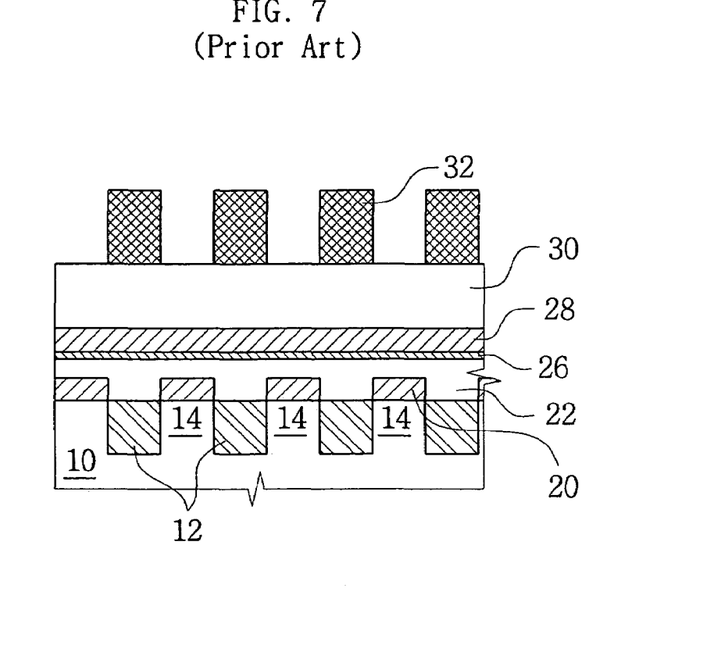
FIG. 7 is a cross-sectional diagram illustrating a process of depositing layers for the bit lines.

Referring to FIG. 7, a barrier metal layer 26 is deposited on the first interlayer dielectric layer 22, and then a conductive layer 28 for the bit lines and a mask layer 30 are deposited in sequence thereon. Next, a first photoresist pattern 32 is formed on the mask layer 30. The conductive layer 28 for the bit lines is made of tungsten, for example, and the mask layer 30 is made of silicon nitride, for example.

Figure 8:
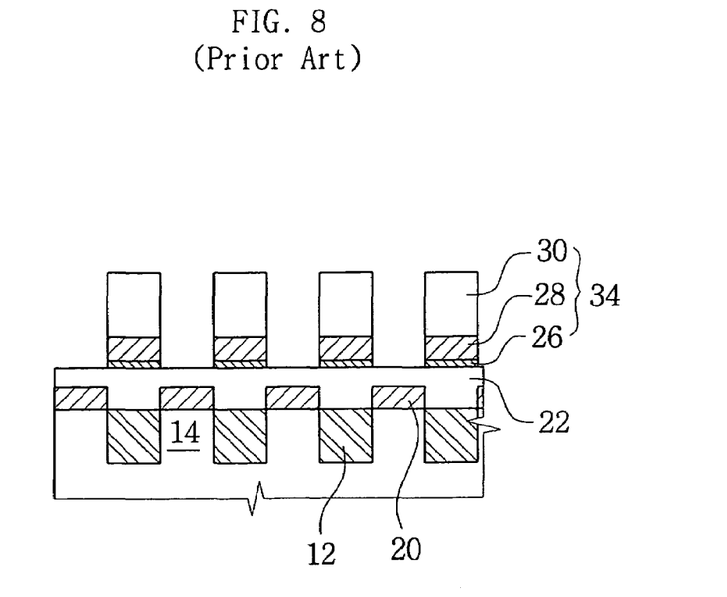
FIG. 8 is a cross-sectional diagram illustrating a process of forming the bit lines.
Figure 9:
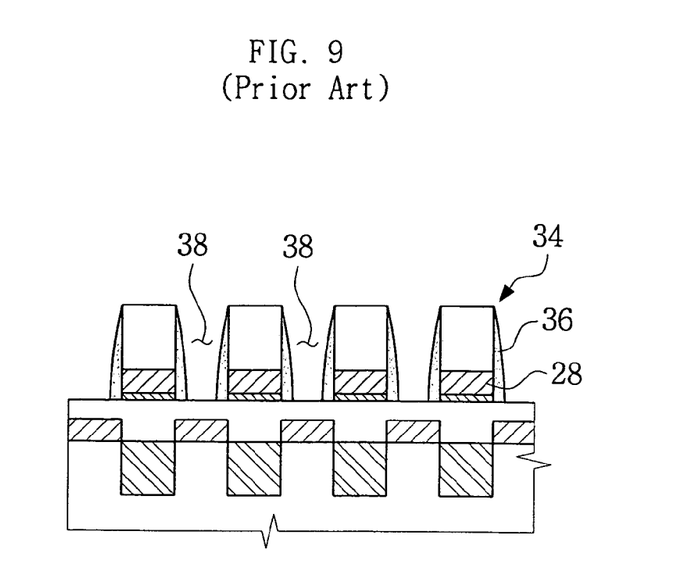
FIG. 9 is a cross-sectional diagram illustrating a process of forming a bit line spacer.

While the first photoresist pattern 32 is used as a mask, the mask layer 30 is selectively etched as shown in FIG. 8. The first photoresist pattern 32 is then removed. Furthermore, by using the patterned mask layer 30 as a mask, the conductive layer 28 and the barrier metal layer 26 are selectively etched in sequence, thus producing the bit lines 34. In this step, because the mask layer 30 is used as an etch mask, upper portions of the mask layer 30 are damaged to several hundreds of angstroms (Å) by etching. To compensate in advance for this loss, the mask layer 30 should be deposited to a thickness of about 3000 Å or more. If not, the conductive layer 26 will be undesirably exposed in a subsequent etching step. After the bit lines 34 are formed, as shown in FIG. 9, a spacer 36 of silicon nitride may be formed on sidewalls of the bit lines 34 to protect the conductive layer 28.

Figure 10:
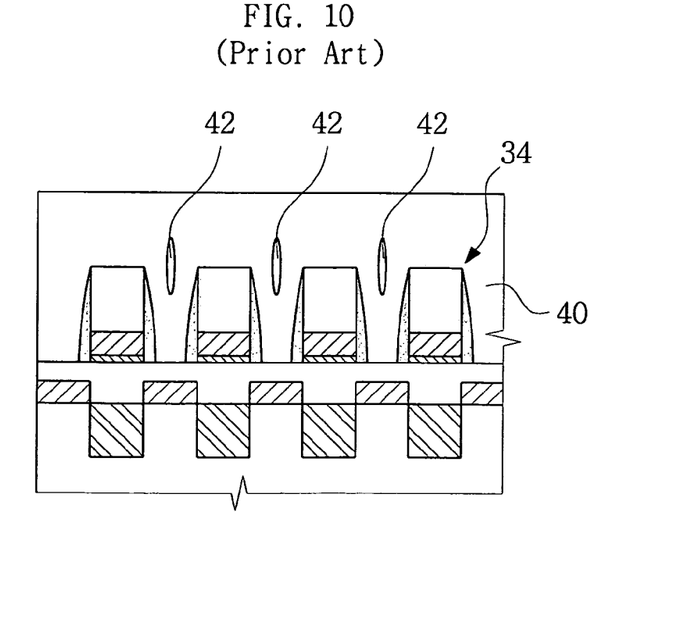
FIG. 10 is a cross-sectional diagram illustrating a process of depositing a second interlayer dielectric layer.

The above-discussed process for forming the bit lines 34 may invite a high aspect ratio of a gap 38 between the adjacent bit lines 34. So, as shown in FIG. 10, voids 42 may be formed due to a high aspect ratio of the gap 38 when the gap 38 is filled with a second interlayer dielectric layer 40.

Figure 11:
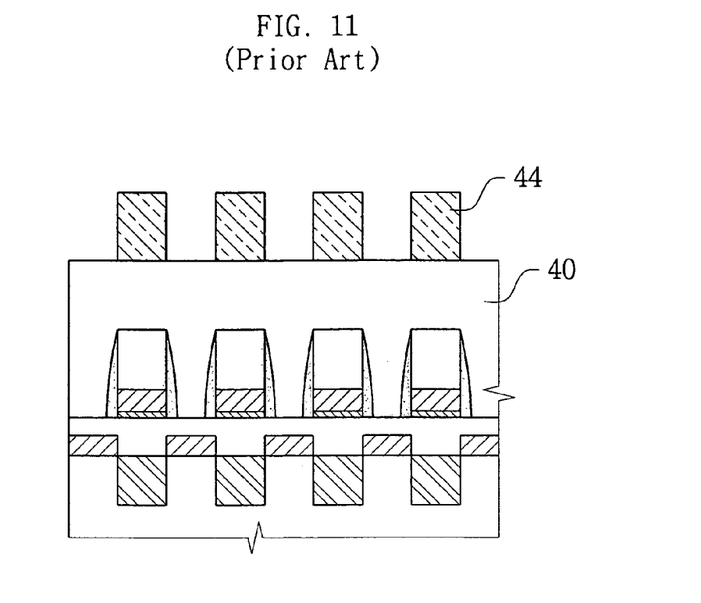
FIG. 11 is a cross-sectional diagram illustrating a process of forming a second photoresist pattern.
Figure 12:
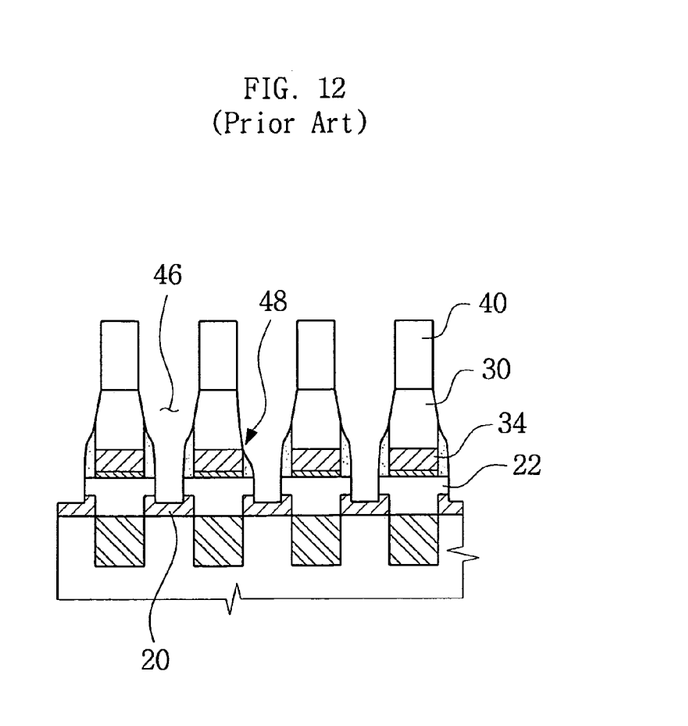
FIG. 12 is a cross-sectional diagram illustrating a process of forming contact holes for the storage node contacts in a self-aligned manner.

The second interlayer dielectric layer 40 is planarized and then, as shown in FIG. 11, a second photoresist pattern 44 is formed thereon. Thereafter, as shown in FIG. 12, the second and first interlayer dielectric layers 40 and 22 are selectively etched in sequence through the second photoresist pattern 44, and thereby contact holes 46 for the storage node contacts are produced between the bit lines 34. The second photoresist pattern 44 is then removed. In this step, an etching process of both the interlayer dielectric layers 40 and 22 is performed using the silicon nitride layer 30 as a mask, namely, in a self-aligned manner, until the storage node contact pad 20 is exposed.

Figure 13:
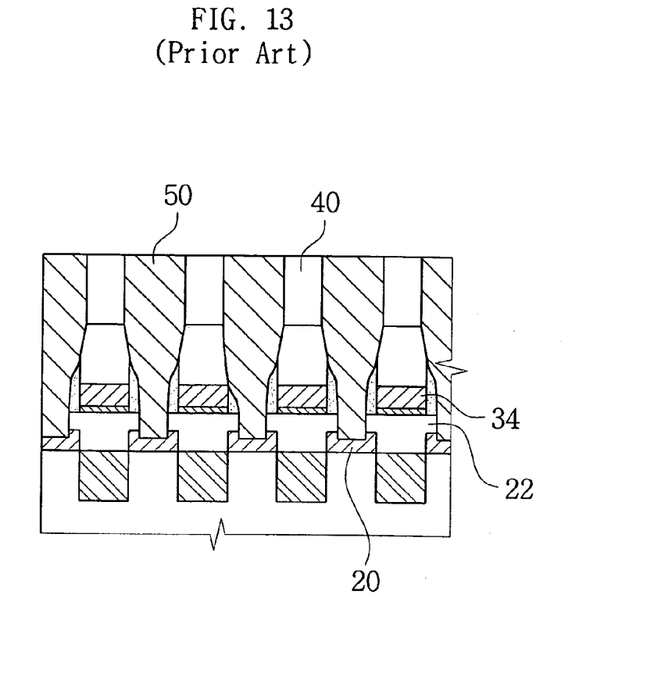
FIG. 13 is a cross-sectional diagram illustrating a process of forming the storage node contacts.

The silicon nitride of the mask layer 30 has an inadequate etch selectivity to oxidize the second interlayer dielectric layer 40. So, while the contact hole 46 is formed in a self-aligned manner, an upper shoulder of the bit line 34 is attacked and narrowed, as indicated by the reference numeral 48. This may cause an unfavorable short circuit between the bit line 34 and the storage node contact 50 when the contact hole 46 is filled with conductive material, such as doped polysilicon, to form the storage node contact 50, as shown in FIG. 13.

Embodiments of the invention address these and other disadvantages of the conventional art.

SUMMARY OF THE INVENTION

A method of forming a self-aligned contact of a semiconductor device according to some embodiments of the invention include forming a plurality of conductive lines spaced apart from each other and passing over a plurality of conductive regions; forming an insulating layer over and between the conductive lines; forming a plurality of contact holes selectively exposing the conductive regions by selectively removing the insulating layer without exposing the conductive lines; extending the contact holes by using an isotropic etching until the conductive lines begin to be exposed; and forming contacts in the contact holes such that the contacts are coupled to the conductive regions. The method may further include forming a contact spacer on sidewalls of the contact holes after the contact holes are extended.

BRIEF DESCRIPTION OF THE DRAWINGS

FIGS. 1 through 6 illustrate a conventional method of fabricating a semiconductor device.

FIGS. 7 through 13 are cross-sectional diagrams taken along the line A—A of FIG. 6, namely, in a word line direction, that illustrate a conventional method of forming a self-aligned contact.

FIGS. 14 through 20 illustrate a method of forming a self-aligned contact of a semiconductor device in accordance with some embodiments of the invention.

DETAILED DESCRIPTION OF THE INVENTION

Some exemplary, non-limiting embodiments of the invention will now be described more fully hereinafter with reference to the accompanying drawings. This invention may, however, be embodied in many different forms and should not be construed as limited to the exemplary embodiment set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In the description, well-known structures and processes have not been described or illustrated in detail to avoid obscuring the invention. It will be appreciated that the figures are not drawn to scale. Rather, for simplicity and clarity of illustration, the dimensions of some of the elements are exaggerated relative to other elements. Like reference numerals and characters are used for like and corresponding parts of the various drawings.

FIGS. 14 through 20 illustrate a method of forming a self-aligned contact of a semiconductor device, such as a memory device, in accordance with some embodiments of the invention. FIGS. 14 through 20 are cross-sectional diagrams taken along the line A—A in FIG. 6, namely, in a word line direction.

Figure 14:
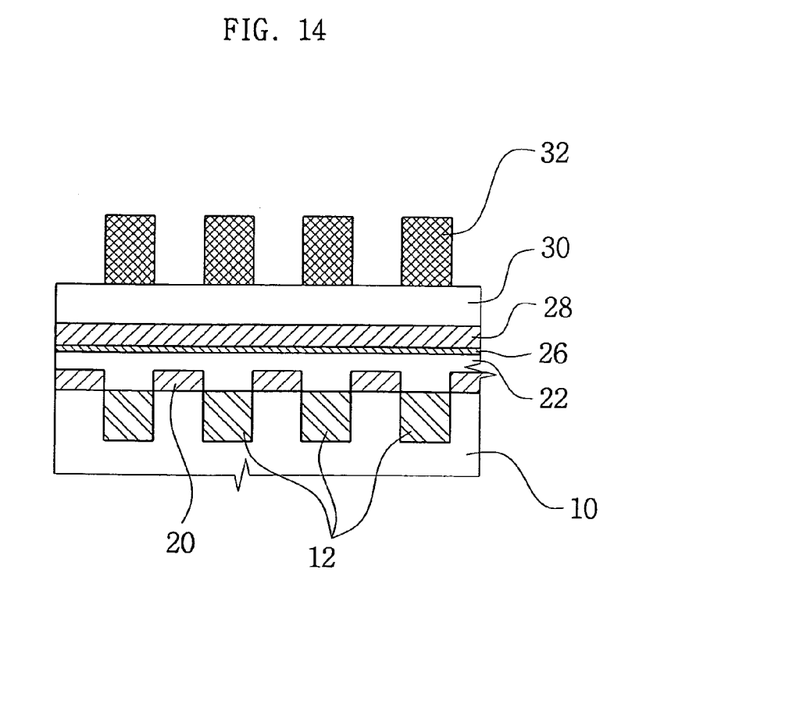
FIG. 14 is a cross-sectional diagram illustrating a structure prior to the formation of bit lines.

FIG. 14 shows a structure prior to the formation of bit lines. Referring to FIG. 14, an isolation region 12 is formed in a semiconductor substrate 10. As is best shown in FIG. 1, a number of active regions 14 are defined and surrounded by the isolation region 12. Next, as is best shown in FIG. 2, a plurality of word lines 16 are formed on the substrate 10 that are spaced apart from each other. Thereafter, as best shown in FIG. 3, bit line contact pads 18 and storage node contact pads 20 are formed between the word lines 16 in the active regions 14. Next, a first interlayer dielectric layer 22 is coated to cover the resultant structure, and, as best shown in FIG. 4, bit line contacts 24 are selectively formed in the first interlayer dielectric layer 22. The bit line contacts 24 extend downward to the bit line contact pads 18.

Thereafter, a barrier metal layer 26, a conductive layer 28, and a mask layer 30 are deposited in sequence on the first interlayer dielectric layer 22. The conductive layer 28 may be made of tungsten, titanium, or another suitable conductive material or combination of conductive materials. The mask layer 30 may be made of silicon nitride or other suitable materials. The deposited thickness of the mask layer 30 is relatively thin, for example, about 2500 Å, in comparison with the aforementioned conventional method.

Figure 15:
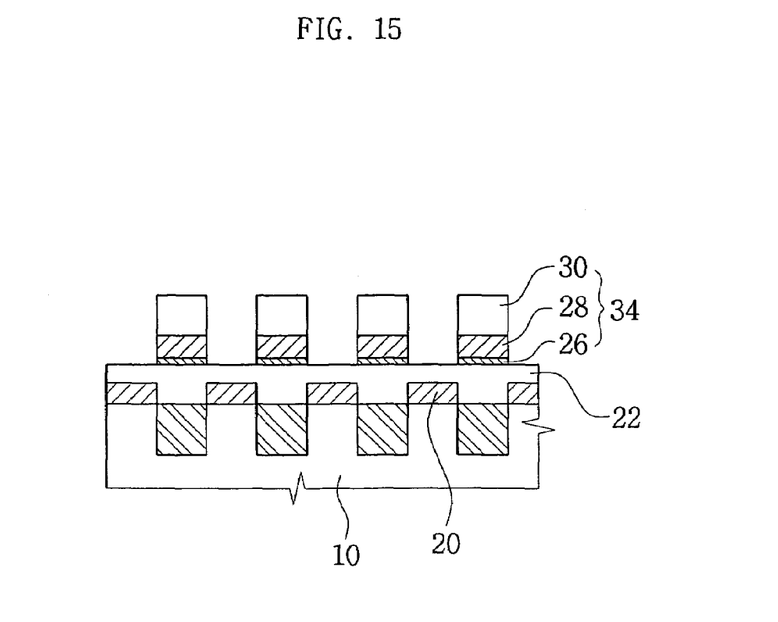
FIG. 15 is a cross-sectional diagram illustrating a process of forming the bit lines.

Furthermore, a photoresist material is coated on the mask layer 30 and patterned to form a first photoresist pattern 32. The first photoresist pattern 32 is used as an etch mask, and the mask layer 30 is selectively etched through the first photoresist pattern 32. Then the first photoresist pattern 32 is removed. Next, while using the patterned mask layer 30 as an etch mask, the conductive layer 28 and the barrier metal layer 26 are selectively etched in sequence, thus producing the bit lines 34 as shown in FIG. 15.

Figure 16:
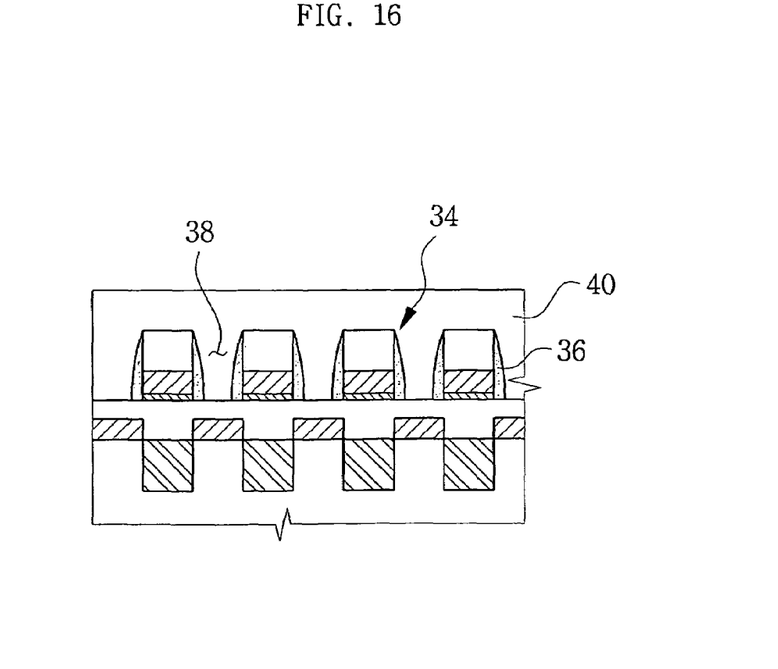
FIG. 16 is a cross-sectional diagram illustrating a process of depositing a second interlayer dielectric layer.

Subsequently, silicon nitride is deposited over the resultant structure to a thickness of about 100 Å and etched back. So, as shown in FIG. 16, a spacer 36 of silicon nitride is formed on sidewalls of the bit lines 34. The mask layer 30 and the bit line spacer 36 have reduced thickness in comparison with the conventional method, so that the aspect ratio of a gap 38 between the adjacent bit lines 34 is decreased. Therefore, when the gap 38 is filled with a second interlayer dielectric layer 40, the formation of undesirable voids may be prevented. It is desirable that the second interlayer dielectric layer 40 have a lower etch rate than the first interlayer dielectric layer 22.

Figure 17:
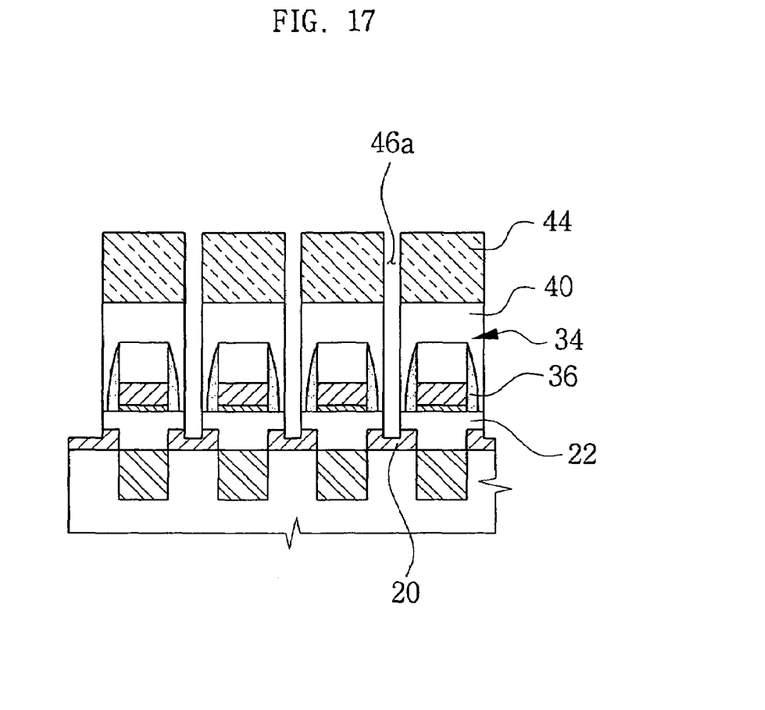
FIG. 17 is a cross-sectional diagram illustrating a process of forming contact holes for the storage node contacts in a self-aligned manner.

After the second interlayer dielectric layer 40 is planarized, a second photoresist pattern 44 is formed thereon as shown in FIG. 17. In comparison with the conventional method, the second photoresist pattern 44 has a broader pattern width and a narrower pattern interval. Therefore, when the second and first interlayer dielectric layers 40 and 22 are selectively etched in sequence through the second photoresist pattern 44, first contact holes 46a having relatively smaller diameters are formed in the interlayer dielectric layers 40 and 22. The smaller first contact holes 46a do not expose the mask layer 30 and provide an alignment margin. An etching process for forming the first contact holes 46a proceeds until the storage node contact pads 20 are exposed. Then the second photoresist pattern 44 is removed.

Figure 18:
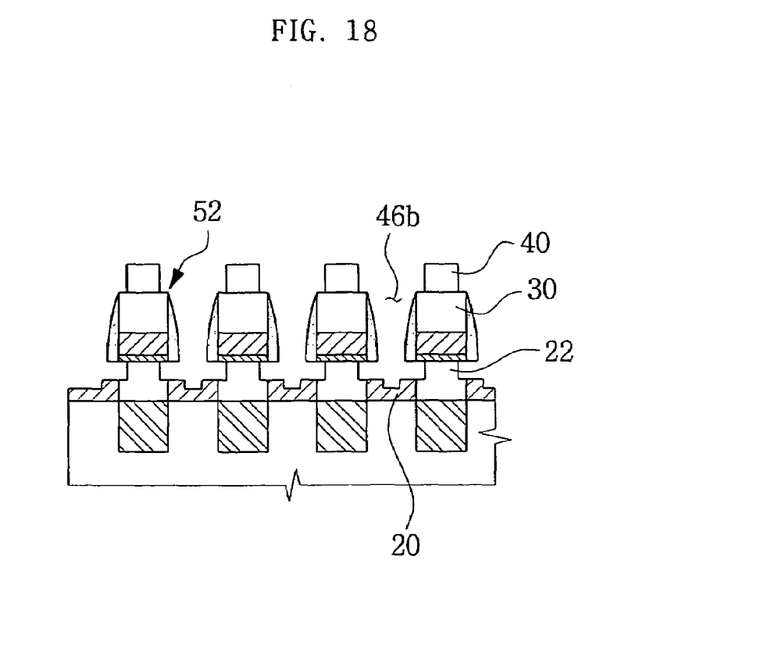
FIG. 18 is a cross-sectional view showing a process of extending the contact holes through isotropic etching.

Thereafter, as shown in FIG. 18, an isotropic etching process such as wet etching is performed to form second contact holes 46b until the mask layer 30 begins to be exposed as indicated by a reference numeral 52. As a result, the thickness of the second interlayer dielectric layer 40 is reduced as much as it is etched. In addition, lower portions of the second contact holes 46b become wider because the first interlayer dielectric layer 22 has a higher etch rate than the second interlayer dielectric layer 40. The wide lower portion of the second, i.e., final, contact hole 46b may improve contact resistance. Moreover, the above-discussed dual etching process may provide the contact holes 46b without damaging the bit line mask layer 30.

Figure 19:
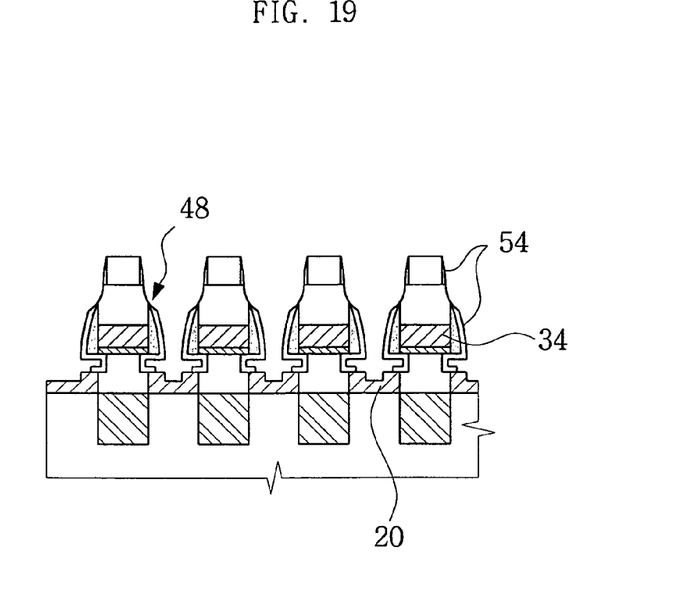
FIG. 19 is a cross-sectional diagram illustrating a process of forming a storage node contact spacer.

Next, silicon nitride is coated over the resultant structure to a thickness of several hundreds of angstroms and etched back so as to form a storage node contact spacer 54 on sidewalls of the contact hole 46b, as shown in FIG. 19. The storage node contact spacer 54 enhances the insulating property between the bit line 34 and a storage node contact (50 of FIG. 20) that will be formed later. An etch-back process for forming the storage node contact spacer 54 may transform an upper shoulder of the bit line mask layer 30 into a shape similar to that of the conventional one. Although the shape may be similar, as compared to the conventional process the upper shoulder of the bit line 34 now has a sufficient, reliable thickness, as indicated by the reference numeral 48.

Figure 20:
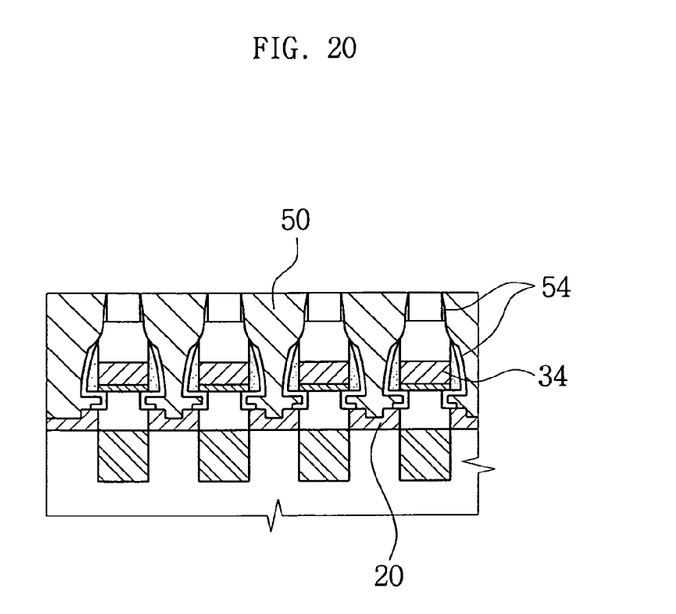
FIG. 20 is a cross-sectional diagram illustrating a process of forming the storage node contacts.

As shown in FIG. 20, the second contact holes 46b are then filled with conductive material such as doped polysilicon so as to form the storage node contact 50. After forming the self-aligned contact in the above-described manner, a capacitor including a storage electrode may be formed through well-known processes.

As discussed above, initially the contact hole for the storage node contact has a smaller diameter that does not expose the bit line. The contact hole for the storage node contact is then extended through an isotropic etching process. This method prevents an unfavorable short circuit between the bit line and the storage node contact, and further, improves storage node contact resistance.

There are many ways to practice the invention. Exemplary, non-limiting descriptions of some embodiments of the invention appear in the following paragraphs.

According to some embodiments of the invention, a method includes providing a plurality of conductive regions in a semiconductor substrate; forming a first insulating layer on the semiconductor substrate so as to cover the conductive regions; forming a plurality of conductive lines on the first insulating layer at regular intervals; forming a second insulating layer on the first insulating layer so as to cover the conductive lines; forming a plurality of contact holes selectively exposing the conductive regions by selectively removing both the first insulating layer and the second insulating layer without exposing the conductive lines; extending the contact holes by using an isotropic etching until the conductive lines begin to be exposed; and forming contacts coupled to the conductive regions by filling the contact holes with conductive material.

The method may further include depositing and etching back insulating material after the contact holes are extended to form contact spacers on sidewalls of the contact holes. Furthermore, the first insulating layer may have a higher etch rate than the second insulating layer. In addition, each conductive line may include a conductive layer and a mask layer formed on the conductive layer.

According to some other embodiments of the invention, a method includes forming word lines on a semiconductor substrate, the word lines spaced apart from each other; forming first contact pads and second contact pads between the word lines; forming a first dielectric layer covering the word lines and the first and second contact pads; forming first contacts coupled to the first contact pads by selectively removing the first dielectric layer; forming a plurality of bit lines coupled to the first contacts and crossing over the word lines; forming a second dielectric layer covering the bit lines; forming a plurality of contact holes selectively exposing the second contact pads by selectively removing both the first dielectric layer and the second dielectric layer without exposing the bit lines; extending the contact holes by using a wet etching until the bit lines begin to be exposed; and forming second contacts coupled to the second contact pads by filling the contact holes with conductive material.

The method may further include depositing and etching back insulating material after the contact holes are extended to form contact spacers on sidewalls of the contact holes. Furthermore, the first dielectric layer may have a higher etch rate than the second dielectric layer. In addition, each bit line may include a conductive layer and a mask layer formed on the conductive layer. The mask layer may have a thickness of about 2500 Å, and the second contacts may be storage node contacts.

While this invention has been particularly shown and described with reference to some exemplary embodiments, it will be understood by those skilled in the art that various changes in form and details may be made therein without departing from the spirit and scope of the invention as defined by the appended claims.

We claim:

1. A method of forming self-aligned contacts for a semiconductor device comprising:
   forming conductive lines spaced apart from each other and passing over conductive regions;
   forming an insulating layer over and between the conductive lines;
   selectively removing the insulating layer, without exposing the conductive lines, to form contact holes that expose the conductive regions;
   isotropically etching to extend the contact holes until the conductive lines are exposed; and
   forming contacts in the contact holes such that the contacts are coupled to the conductive regions.

2. The method of claim 1, further comprising:
   after isotropically etching to extend the contact holes, forming contact spacers on sidewalls of the contact holes.

3. A method of forming self-aligned contacts for a semiconductor device comprising:
   providing conductive regions in a semiconductor substrate;
   covering the conductive regions by forming a first insulating layer on the semiconductor substrate;

forming conductive lines on the first insulating layer at regular intervals;

covering the conductive lines by forming a second insulating layer on the first insulating layer;

selectively removing the first insulating layer and the second insulating layer, without exposing the conductive lines, to form contact holes that expose the conductive regions;

isotropically etching to extend the contact holes until the conductive lines are exposed; and filling the contact holes with conductive material to form contacts coupled to the conductive regions.

4. The method of claim 3, further comprising:

depositing and etching back insulating material after the contact holes are extended to form contact spacers on sidewalls of the contact holes.

5. The method of claim 3, wherein selectively removing the first insulating layer and the second insulating layer comprises etching the first insulating layer at a faster etch rate than the second insulating layer.

6. The method of claim 3, wherein forming conductive lines comprises:

forming conductive layers; and forming mask layers on the conductive layers.

7. A method of forming self-aligned contacts for a semiconductor device comprising:

forming word lines on a semiconductor substrate, the word lines being spaced apart from each other;

forming first contact pads and second contact pads between the word lines;

covering the word lines, the first contact pads, and the second contact pads with a first dielectric layer;

selectively removing the first dielectric layer to form first contacts that are coupled to the first contact pads;

forming bit lines that are coupled to the first contacts and that cross over the word lines;

covering the bit lines with a second dielectric layer;

selectively removing the first dielectric layer and the second dielectric layer, without exposing the bit lines, to form contact holes that expose the second contact pads;

wet etching to extend the contact holes until the bit lines are exposed; and filling the contact holes with conductive material to form second contacts coupled to the second contact pads.

8. The method of claim 7, further comprising:

after wet etching to extend the contact holes, depositing and etching back insulating material to form contact spacers on sidewalls of the contact holes.

9. The method of claim 7, wherein selectively removing the first dielectric layer and the second dielectric layer comprises etching the first dielectric layer at a faster etch rate than the second dielectric layer.

10. The method of claim 7, wherein forming bit lines comprises:

forming conductive layers; and forming mask layers on the conductive layers.

11. The method of claim 10, wherein forming mask layers comprises forming mask layers to a thickness of about 2500 Å.

12. The method of claim 7, wherein filling the contact holes with conductive material to form second contacts comprises filling the contact holes with conductive material to form storage node contacts.

* * * * *